United States Patent [19]

Pai et al.

[11] Patent Number: 5,399,239
[45] Date of Patent: Mar. 21, 1995

[54] METHOD OF FABRICATING CONDUCTIVE STRUCTURES ON SUBSTRATES

[75] Inventors: Deepak K. Pai, Burnsville; Lowell D. Lund, Eden Prairie, both of Minn.

[73] Assignee: Ceridian Corporation, Bloomington, Minn.

[21] Appl. No.: 992,620

[22] Filed: Dec. 18, 1992

[51] Int. Cl.⁶ .......................................... H01L 21/00
[52] U.S. Cl. ................................. 156/656; 156/659.1; 156/661.1
[58] Field of Search ................ 361/395, 397, 399; 437/187, 195, 228, 210; 156/631, 633, 656

[56] References Cited

U.S. PATENT DOCUMENTS

| | | | |
|---|---|---|---|
| 3,960,623 | 6/1976 | Gantley | 156/631 |
| 4,054,484 | 10/1977 | Lesh et al. | 156/666 X |
| 4,068,022 | 1/1978 | Glick | 427/125 |
| 4,120,707 | 10/1978 | Beasom | 437/187 |
| 4,159,222 | 6/1979 | Lebow et al. | 156/632 |
| 4,325,780 | 4/1982 | Schulz, Sr. | 156/659.1 |
| 4,364,777 | 12/1982 | Grünert et al. | 134/29 |
| 4,407,860 | 10/1983 | Fleming et al. | 427/98 |
| 4,467,067 | 8/1984 | Valayil et al. | 524/435 |
| 4,540,462 | 9/1985 | Mizunoya et al. | 156/656 X |
| 4,557,796 | 12/1985 | Druschke et al. | 156/656 X |
| 4,568,413 | 2/1986 | Toth et al. | 156/151 |
| 4,605,471 | 8/1986 | Mitchell | 156/645 |
| 4,649,417 | 3/1987 | Burgess et al. | 361/397 |
| 4,662,956 | 5/1987 | Roth et al. | 156/657 |
| 4,756,795 | 7/1988 | Bakos et al. | 156/645 |
| 4,935,305 | 6/1990 | Kanehiro | 428/457 |
| 4,961,987 | 10/1990 | Okuno et al. | 361/397 |
| 4,985,294 | 1/1991 | Watanabe et al. | 361/397 |
| 5,011,732 | 4/1991 | Takeuchi et al. | 361/397 |
| 5,021,287 | 6/1991 | Otagiri et al. | 361/397 |
| 5,087,509 | 2/1992 | Kuromitsu et al. | 361/397 |
| 5,165,986 | 1/1992 | Gardner et al. | 361/397 |
| 5,190,892 | 3/1993 | Sano | 437/944 |
| 5,231,757 | 8/1993 | Chantraine et al. | 156/644 X |
| 5,300,172 | 4/1994 | Ishiwata et al. | 156/631 X |

FOREIGN PATENT DOCUMENTS

| | | | |
|---|---|---|---|
| 395871 | 11/1990 | European Pat. Off. | 156/631 |
| 70077 | 3/1990 | Japan | 156/631 |

OTHER PUBLICATIONS

Wolf et al. "Silicon Processing for the VLSI ERA Vol. 1: Process Technology", Lattice Press, 1986, p. 428.

Kerm, "The Evolution of Silicon Wafer Cleaning Technology", J. Electrochem. Soc. vol. 137, No. 6 Jun. 1990, pp. 1887–1892.

Electronics Manufacturing Productivity Facility, *Electron '91 Proceedings*, Oct. 22 and 23, 1991.

Lanxide Corporation, *Preliminary Technical Datasheet*, Sep. 8, 1989.

*Primary Examiner*—Thi Dang
*Attorney, Agent, or Firm*—Kinney & Lange

[57] ABSTRACT

The present invention is an integrated heat sink module and a method of fabricating conductive structures on a substrate. The method of the present invention includes cleaning a substrate material to remove any impurities present on the substrate surface. The method further includes placing a protective layer resilient to chemicals used in conductive structure formation, on a first surface. The first surface is opposite a second surface on which conductive structures are formed. The method includes forming conductive structures on the second surface of the substrate. The protective layer is then removed from the first surface of the substrate.

26 Claims, 1 Drawing Sheet

METHOD OF FABRICATING CONDUCTIVE STRUCTURES ON SUBSTRATES

BACKGROUND OF THE INVENTION

The present invention relates to an apparatus and method for fabricating conductive structures on substrates and, more particularly, to a method for fabricating conductive structures on substrate materials that are not compatible with processes used to fabricate conductive structures.

Multi-chip modules are presently in use in high performance high density systems. These multi-chip modules include a substrate or base material upon which a thin film circuit is deposited. This thin film circuit provides electrical interconnection for components that are electrically connected to the thin film circuit. These components that are mounted to the thin film circuit are frequently very large scale integrated circuits (VLSI).

The thin film technology used in the manufacture of these multi-chip modules provides relatively short interconnection distances and low interconnect capacitance between integrated components, which enhances the system performance. Thin film technology frequently makes use of multiple layers of thin film conducting material. These thin film conducting layers are separated by a dielectric material such as polyimide. Each layer of conducting material is defined using known processes such as a photolithographic process. Thin film processing is generally described in the article entitled "Multi-Chip Modules for High Performance Military Electronics," from *Electrecon '91 Proceedings*, sponsored by the Electronics Manufacturing Productivity Facility, Indianapolis, Ind., Oct. 22 and 23, 1991, and incorporated herein by reference.

The multi-chip module includes a heat sink for providing mechanical strength to the module, and for providing thermal conductivity between the base material and a chassis in which the heat sink is mounted. An adhesive layer is applied to the base material opposite the thin film circuit for bonding the base material to the heat sink. The heat sink is then mounted within a chassis that is cooled by some form of cooling, such as conduction, convection, or some combination of both. Heat generated by the integrated circuits is transferred through the base material, adhesive layer, heat sink and then to the chassis, thereby cooling the integrated circuits.

The thermal conductivity of the path between the integrated circuits and the chassis tends to be limited by both the base material and the adhesive layer. Adhesives generally have very low thermal conductivity, typically less than five watts per meter per degree Kelvin (W/M K°). Base materials that are compatible with chemicals used in thin film processing typically have relatively low thermal conductivities which range between 20 and 170 watts per meter per degree Kelvin.

There is an ever present need for improved thermal conductivity between the integrated circuits and the chassis. Improved thermal conductivity tends to allow the integrated circuits to operate at faster speeds thereby improving the performance of the system. In addition, improving the thermal conductivity allows either more integrated circuits to be placed on a given size module or allows the module size to be reduced thereby reducing the system size. Finally, improved thermal conductivity tends to improve the reliability and life of the system.

These base materials should in addition to having good thermal conductivity should also have mechanical properties that are suitable for the base material. These mechanical properties include a temperature coefficient of expansion that is compatible with the temperature coefficient of expansion of the materials in the thin film circuit. In addition, the base material should have a high Young's constant or modulus of elasticity so that the substrate will not warp or bow as the polyimide layers are cured and shrink during the thin film circuit processing. Finally, the base material must be resistant to the chemicals used in the thin film processing. These chemicals include KOH, NaOH, $H_2SO_4$ and various developers.

SUMMARY OF THE INVENTION

One aspect of the present invention is a method for fabricating conductive structures on substrates. The method includes placing a protective layer that is resistant to chemicals used in conductive structure formation, on a first surface opposite a second surface on which conductive structures are formed. The method further includes forming conductive structures on the second surface of the substrate and removing the protective layer from the first layer of the substrate.

In one preferred embodiment, the present invention is a thin film circuit suited for mounting electrical components thereto. The thin film circuit includes at least one conductive structure that is suited for connection to electrical components. The invention further includes a substrate material that has a thermal conductivity greater than 180 watts per meter per degrees Kelvin and a modulus of elasticity greater than 200 gigapascal.

In another preferred embodiment, the present invention is a module suited for mounting in a chassis. The module includes a substrate having a thermal conductivity greater than 180 watts per meter per degree Kelvin and a modulus of elasticity greater than 200 gigapascal. The module includes a thin film circuit that is attached to the substrate. The module further includes at least one component that is connected to the thin film circuit.

DETAILED DESCRIPTION OF THE PREFERRED EMBODIMENTS

Figure 1:
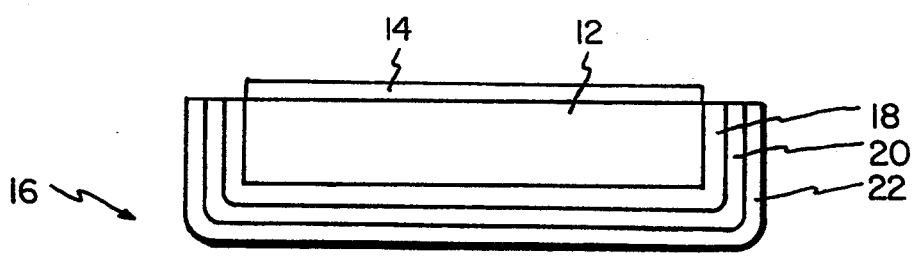
FIG. 1 is a cross-sectional view of a base shown with a photoresist layer and three protective layers, exaggerated in thickness for clarity, deposited thereon.

The representations of the multi-chip module as disclosed in FIGS. 1 through 4, are greatly simplified and not drawn to scale for purposes of clearness of illustration and disclosure of the method of this invention. More specifically, the structure and electrical circuit as well as the interconnection to the integrated circuits are not shown, and the thicknesses of the various coatings are greatly exaggerated and not shown in the desired proportions. In the following description, the necessary artwork for the conventional steps of FIG. 3 that are normally used in the manufacture of the thin film circuit are not described as they are well known.

FIGS. 1 through 4 disclose a method for fabricating conductive structures on substrates of the present invention. The method of the present invention is used for fabricating a heat sink module 10 shown in FIG. 4.

The method of the present invention makes use of a base or substrate 12 that is made from a material that is selected to have very high thermal conductivity, a high Young's constant or modulus of elasticity, and a temperature coefficient of expansion that is compatible with conductive structures that are constructed thereon. In one preferred embodiment, the base 12 is made from an aluminum based composite material such as aluminum and graphite or aluminum and silicon carbide. In one preferred embodiment, the base 12 is made from a material sold under the trademark MCX-622 ™ by the Lanxide Corporation of Newark, Del. These composite materials have high thermal conductivity, typically in a range from 180 to 400 watts per meter per degree Kelvin. In addition, these composite materials have a Young's constant or modulus of elasticity that is typically greater than 200 gigapascal (GPa).

The base 12 is at least part of a thermal path between components that are mounted to the module 10 and a chassis (not shown). Therefore, the selection of a material having very high thermal conductivity tends to improve the thermal conductivity of the thermal path between components on module 10 and the chassis. This improved thermal path tends to allow operation of these components at lower temperatures thereby improving the system speed, reliability and life.

In addition, the material used for the base 12 should have a temperature coefficient of expansion (TCE) that is compatible with the temperature coefficient of expansion for the conductive structure that is positioned on the base 12. Incompatibility between these temperature coefficients can result in breaks in conductive paths within the conductive structure causing improper operation of module 10. In one preferred embodiment, the base 12 has a temperature coefficient of expansion that is in a range from 5 to 8 parts per million per degree Kelvin. This temperature coefficient of expansion range is compatible with copper/polyimide thin film circuits as well as components that are frequently mounted to these thin film circuits.

Finally, the material used for the base 12 should provide mechanical strength to the conductive structures. This mechanical strength prevents the base 12 from warping or bowing during formation of the conductive structures. Warping or bowing frequently occurs during curing of a dielectric material that is used to separate one or more conductive layers that are included in the conductive structure. In one preferred embodiment, the dielectric material is made from polyimide that, when cured under high temperature, shrinks or contracts which can cause the base 12 to bow or warp. This bowing or warping can cause changes in the flatness of the base 12 relative to a photomask used in photolithographic processes used to define conductive structures. These changes in flatness can cause alignment or spacing problems between one or more conductive layers resulting in defects within the conductive structure.

In addition, improved mechanical strength of the base 12 tends to prevent flexing or bending of the module 10 during shock and vibration. This flexing or bending can cause breaks or cracks in both the conductive structures and the component connections to these conductive structures that results in either module failure or reliability problems.

Larger sized modules 10 require a correspondingly larger sized base portions 12. Larger base portions 12 incur greater forces during polyimide curing and therefor must have a higher modulus of elasticity to resist warping or bowing. In addition, larger substrates tend to have greater mass and therefore undergo greater forces during shock and vibration, and therefore require a higher modulus of elasticity to resist damage resulting from flexing. In one preferred embodiment, the module or base material is 4.5 inches by 4.5 inches and is 0.125 inches thick. In another preferred embodiment, the module or base material is 6 inches by 6 inches.

An important criteria for selecting the base material is that the base material be compatible with the chemicals used in the process to form the conductive thin film structures. Chemicals that are frequently used in thin film processing include potassium hydroxide (KOH), sodium hydroxide (NaOH), sulfuric acid ($H_2SO_4$), and various developers are not compatible with the base materials contemplated herein. Various composite materials that include non-metallic materials are subject to attack by the chemicals used in thin film processing. Metallic/composite materials of this class include aluminum-based composites such as aluminum/graphite composites or aluminum/silicon carbide composites as well as copper-based composites such as copper/carbon based composites. Non-metallic based composites include polymer-based composite materials.

The method of the present invention makes use of a protective coating so that thin film circuits can be formed on base materials that are not compatible with chemicals used in the thin film processing. As shown in FIGS. 1 through 4, the method of the present invention is used to form conductive structures on a substrate 12 or base material. In one preferred embodiment, the base material 12 is MCX-622 ™, a composite material made from aluminum and silicon carbide. In another preferred embodiment, the base material 12 is a composite material made from aluminum and graphite.

The base material 12 is first cleaned to remove any impurities present on the surface of the substrate. In one preferred embodiment, the substrate 12 is cleaned by placing the substrate in a 10% solution of potassium hydroxide (KOH) for approximately 30 seconds. Alternatively, the substrate may be cleaned in a solution of hydrogen sulfide. In either case, the substrate 12 is then rinsed with deionized water. The substrate is then placed in a ten percent solution of sulfuric acid ($H_2SO_4$) for 30 seconds and then rinsed with deionized water. The substrate 12 is then rinsed with 18 megohm (M$\Omega$) deionized water and vacuum baked.

A mask layer 14 is then placed on a first surface of the base material 12. The mask layer 14 is used to define a surface on the base 12 on which the conductive structure is built. In one preferred embodiment, the mask layer 14 is a layer of photoresist that is deposited on the base material 12 using conventional methods.

A protective layer 16 is deposited on all surfaces of the base material 12 that are not covered by the mask layer 14. The protective layer 16 is selected so that it is capable of adhering to the base material. In addition, the protective layer 16 should also be selected so that it is resistant to chemicals used in the thin film processing.

In one preferred embodiment, the protective layer 16 includes a titanium layer 18, a copper layer 20 and a nickel layer 22. In this preferred embodiment, the titanium layer acts as an adhesion promotor thereby allowing the copper layer 20 to adhere to the base material 12. In this preferred embodiment, the titanium layer is applied using a conventional sputtering process and has a thickness that is in a range from 500 to 700 Å. The titanium layer 18 bonds well to the substrate material 12 while also bonding well to the copper layer 20. This copper layer 20 is applied using a conventional sputtering process. In one preferred embodiment, the copper layer 20 has a thickness of 2,000 Å. The nickel layer 22 bonds well with the copper layer 20 and is inert to the chemicals used in thin film processing. In one preferred embodiment, the nickel layer 22 is applied using a conventional plating process and has a thickness in a range from 400 to 500 Å. The thickness of the nickel layer 22 must be sufficiently thick so that the copper layer 20 is completely covered by the nickel layer 22.

In another preferred embodiment, the protective layer 16 is a polyimide layer that is applied using a conventional spin coating technique. In this preferred embodiment, the polyimide layer is 25 microns thick. After the polyimide protective layer 16 is applied, this layer is cured using a conventional baking process.

Figure 2:
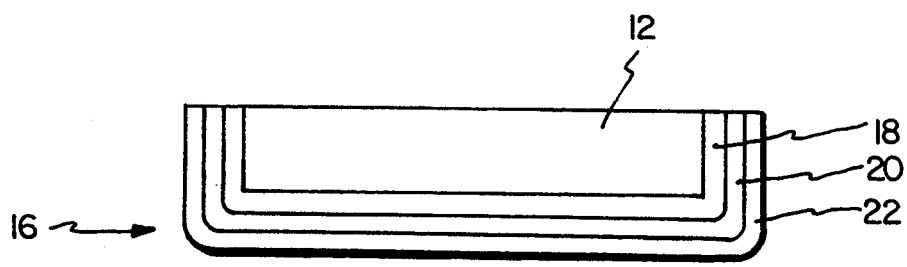
FIG. 2 is a sectional view of a base shown with three protective layers, exaggerated in thickness for clarity, deposited thereon.

As shown in FIG. 2, the mask layer 14 is then removed from the base material 12. In one preferred embodiment, this mask layer 14 is a photoresist layer that is removed or stripped using conventional methods.

Figure 3:
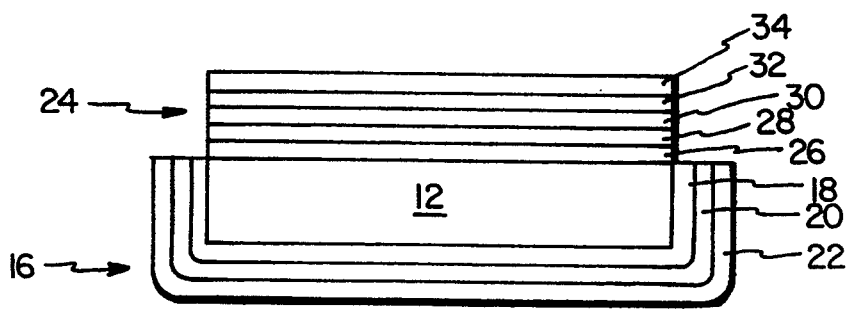
FIG. 3 is a sectional view of a base shown with a five-layer thin film circuit and three protective layers, exaggerated in thickness for clarity, deposited thereon.

As shown in FIG. 3, a conductive structure 24 is then positioned on the surface of the base material 12 that was defined by the photoresist mask layer 14. In one preferred embodiment, the conductive structure 24 is a series of layers 26, 28, 30, 32 and 34 that make up a thin film circuit. Each of the layers 26, 28, 30, 32 and 34 that make up the thin film circuit are defined on the base material 12 using conventional thin film processing techniques. Although only five layers are shown for the conductive structure 24, more layers than five or fewer layers than five may be used depending on the specific application and requirements for the module 10. Layer 26 is typically a dielectric material such as polyimide which is deposited on the surface of the base material 12. The remaining layers 28, 30, 32 and 34 are typically alternating conductive layers and dielectric layers. The protective layer 16 prevents the base material 12 from exposure to the chemicals used in forming the conductive layer 24.

Figure 4:
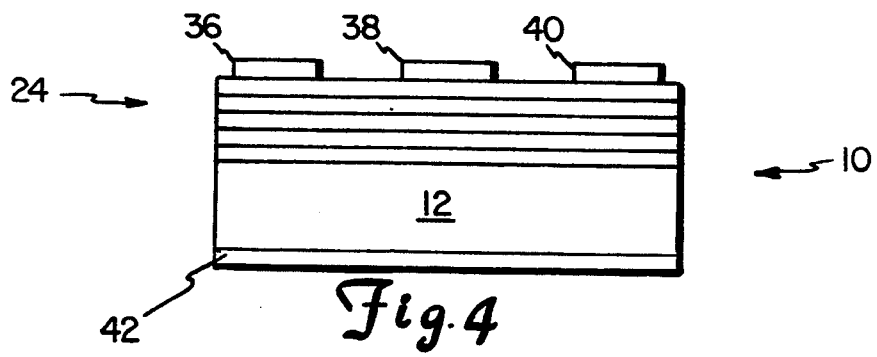
FIG. 4 is a cross-sectional view of a base shown with a five-layer thin film circuit, exaggerated in thickness for clarity, deposited thereon.

As shown in FIG. 4, the protective layer 16 is then removed from the base material 12. In one preferred embodiment, where the protective layer is a titanium layer, a copper layer and a nickel layer, each of these layers must be removed separately. In this preferred embodiment, the nickel layer is removed using a ten percent solution of hydrochloric acid (HCL), the copper layer is removed using ammonium persulfate (AP) and the titanium layer is removed using a five percent solution of hydrofluoric acid (HF).

The module 10 is then completed by attaching one or more components 36, 38 and 40 to the conductive layer 24. In one preferred embodiment, components 36, 38 and 40 are integrated circuits such as very large scale integrated devices (VLSI) or very high speed integrated circuits (VHSIC). These components 36, 38, and 40 are attached in a conventional manner such as soldering. The module 10 is completed by applying a dielectric layer 42 to the base material 12. In one preferred embodiment, the dielectric layer 42 is a polyimide layer that is deposited in a conventional manner.

The completed module 10 exhibits high stiffness and high thermal conductivity. In one preferred embodiment, the module 10 has a thermal conductivity that is greater than 180 watts per meter per degree Kelvin and a modulus of elasticity that is greater than 200 (GPa). Because the module exhibits high strength and thermal conductivity, the module may be mounted directly to the chassis thereby forming an integrated heat sink module. Therefore, the module 10 does not require a separate heat sink to provide strength and thermal conductivity nor does the module 10 require an adhesive layer for bonding the module 10 to a separate heat sink. Instead, a thermal path between components mounted on the conductive structure and the chassis are provided by the conductive structure 24 and the base 12.

Although the present invention has been described with reference to preferred embodiments, workers skilled in the art will recognize that changes may be made in form and detail without departing from the spirit and scope of the invention.

What is claimed is:

1. A method for fabricating thin-film conductive structures on composite substrates, the method comprising:
    providing a composite substrate having first and second surfaces, the first surface being different from the second surface;
    depositing a polyimide layer, resistant to chemicals used in thin-film conductive structure formation, on the first surface of the substrate;
    forming thin-film conductive structures on the second surface of the substrate; and
    removing the polyimide layer from the first surface of the substrate.

2. The method for fabricating conductive structures on substrates of claim 1 further comprising cleaning the substrate material to remove any impurities present on the substrate surfaces.

3. The method for fabricating conductive structures on substrates of claim 2 wherein cleaning comprises placing potassium hydroxide on the substrate and rinsing the substrate with deionized water.

4. The method for fabricating conductive structures on substrates of claim 2 wherein cleaning includes placing hydrogen sulfide on the substrate and rinsing with deionized water.

5. The method for fabricating conductive structures on substrates of claim 1 further comprising placing a masking layer on the second surface of the substrate to define the conductive structures.

6. The method for fabricating conductive structures on substrates of claim 5 wherein the masking layer is a polyimide layer.

7. The method for fabricating conductive structures on substrates of claim 1 wherein the conductive structure is a thin film circuit.

8. The method for fabricating conductive structures on substrates of claim 1 wherein the conductive structure has at least one layer of copper and at least one layer of polyimide.

9. The method for fabricating conductive structures on substrates of claim 1 wherein removing the protective layer comprises lapping the first surface to remove the polyimide.

10. The method for fabricating conductive structures on substrates of claim 1 wherein the substrate is a material having a thermal conductivity greater that 180 watts per meter per degree Kelvin and a modulus of elasticity greater than 200 gigapascal.

11. The method for fabricating conductive structures on substrates of claim 1 wherein the substrate is a metal based composite.

12. The method for fabricating conductive structures on substrates of claim 1 wherein the substrate is a non-metal based composite.

13. The method for fabricating conductive structures on substrates of claim 1 wherein the substrate is an aluminum and carbon based composite.

14. A method for fabricating thin-film conductive structures on composite substrates, the method comprising:
   providing a composite substrate having first and second surfaces, the first surface being different from the second surface;
   placing a titanium layer on the first surface;
   placing a copper layer on the titanium layer;
   placing a nickel layer on the copper layer, the titanium layer, copper layer and nickel layer forming a protective layer resistant to chemicals used in thin-film conductive structure formation on the first surface of the substrate;
   forming thin-film conductive structures on the second surface of the substrate; and
   removing the protective layer from the first surface of the substrate.

15. The method for fabricating conductive structures on substrates of claim 14 further comprising
   cleaning the substrate material to remove any impurities present on the substrate surfaces.

16. The method for fabricating conductive structures on substrates of claim 15 wherein cleaning comprises placing potassium hydroxide on the substrate and rinsing the substrate with deionized water.

17. The method for fabricating conductive structures on substrates of claim 15 wherein cleaning includes placing hydrogen sulfide on the substrate and rinsing with deionized water.

18. The method for fabricating conductive structures on substrates of claim 14 further comprising placing a masking layer on the second surface of the substrate to define the conductive structures.

19. The method for fabricating conductive structures on substrates of claim 18 wherein the masking layer is a polyimide layer.

20. The method for fabricating conductive structures on substrates of claim 14 wherein removing the protective layer comprises:
   immersing the protective layer in hydrochloric acid to remove the nickel layer;
   immersing the protective layer in ammonium persulfate to remove the copper layer; and
   immersing the protective layer in hydrofluoric acid to remove the titanium layer.

21. The method for fabricating conductive structures on substrates of claim 14 wherein the conductive structure is a thin film circuit.

22. The method for fabricating conductive structures on substrates of claim 14 wherein the conductive structure has at least one layer of copper and at least one layer of polyimide.

23. The method for fabricating conductive structures on substrates of claim 14 wherein the substrate is a material having a thermal conductivity greater that 180 watts per meter per degree Kelvin and a modulus of elasticity greater than 200 gigapascal.

24. The method for fabricating conductive structures on substrates of claim 14 wherein the substrate is a metal based composite.

25. The method for fabricating conductive structures on substrates of claim 14 wherein the substrate is a non-metal based composite.

26. The method for fabricating conductive structures on substrates of claim 14 wherein the substrate is an aluminum and carbon based composite.

* * * * *